United States Patent [19]

Takiyama et al.

[11] Patent Number: 5,762,813
[45] Date of Patent: Jun. 9, 1998

[54] METHOD FOR FABRICATING SEMICONDUCTOR DEVICE

[75] Inventors: Makoto Takiyama; Hideki Fujikake, both of Tokyo, Japan

[73] Assignee: Nippon Steel Corporation, Tokyo, Japan

[21] Appl. No.: 615,603

[22] Filed: Mar. 13, 1996

[30] Foreign Application Priority Data

Mar. 14, 1995 [JP] Japan .................................. 7-081776
Jul. 28, 1995 [JP] Japan .................................. 7-212932

[51] Int. Cl.$^6$ .............. B44C 1/22; H01L 21/465; H01L 21/324
[52] U.S. Cl. ............... 216/67; 216/58; 216/72; 216/76; 437/228; 437/225; 437/248; 437/974
[58] Field of Search .................. 437/228, 225, 437/248, 974; 216/58, 67, 72, 76

[56] References Cited

FOREIGN PATENT DOCUMENTS

A-2-16866   6/1989   Japan .
A-2-151031  6/1990   Japan .
A-6-291276  10/1994  Japan .

OTHER PUBLICATIONS

Watanabe, Technology Trend of High Density Memory, Record of SEMI Technology Symposium 93, pp. 11–17, Dec. 1993.

Ikeda et al., Silicon Surface Damage Caused by Fluorocarbon Gas Plasma, Record of 45th Symposium of Semiconductor and Integrated Circuit Technique, pp. 76–81, Dec. 1993 (Abstract Considered Only).

Makihara, Influence Surface Micro–roughness on Device Performance, Record of Ultraclean Technology Workshop, pp. 73–91, Sep. 1992.

*Primary Examiner*—Susan A. Loring
*Attorney, Agent, or Firm*—Law Offices Pollock, Vande Sande & Priddy

[57] ABSTRACT

By using first mixed gas containing carbon atoms and fluorine atoms, a semiconductor substrate is etched. In order to remove a damage layer formed on the surface of the semiconductor substrate by this etching processing, the semiconductor substrate is etched by second mixed gas including gas containing fluorine atoms and oxygen gas having a partial pressure ratio of at least 70%. Thereafter, a semiconductor oxide film is formed on the semiconductor substrate to fabricate a semiconductor device.

30 Claims, 13 Drawing Sheets

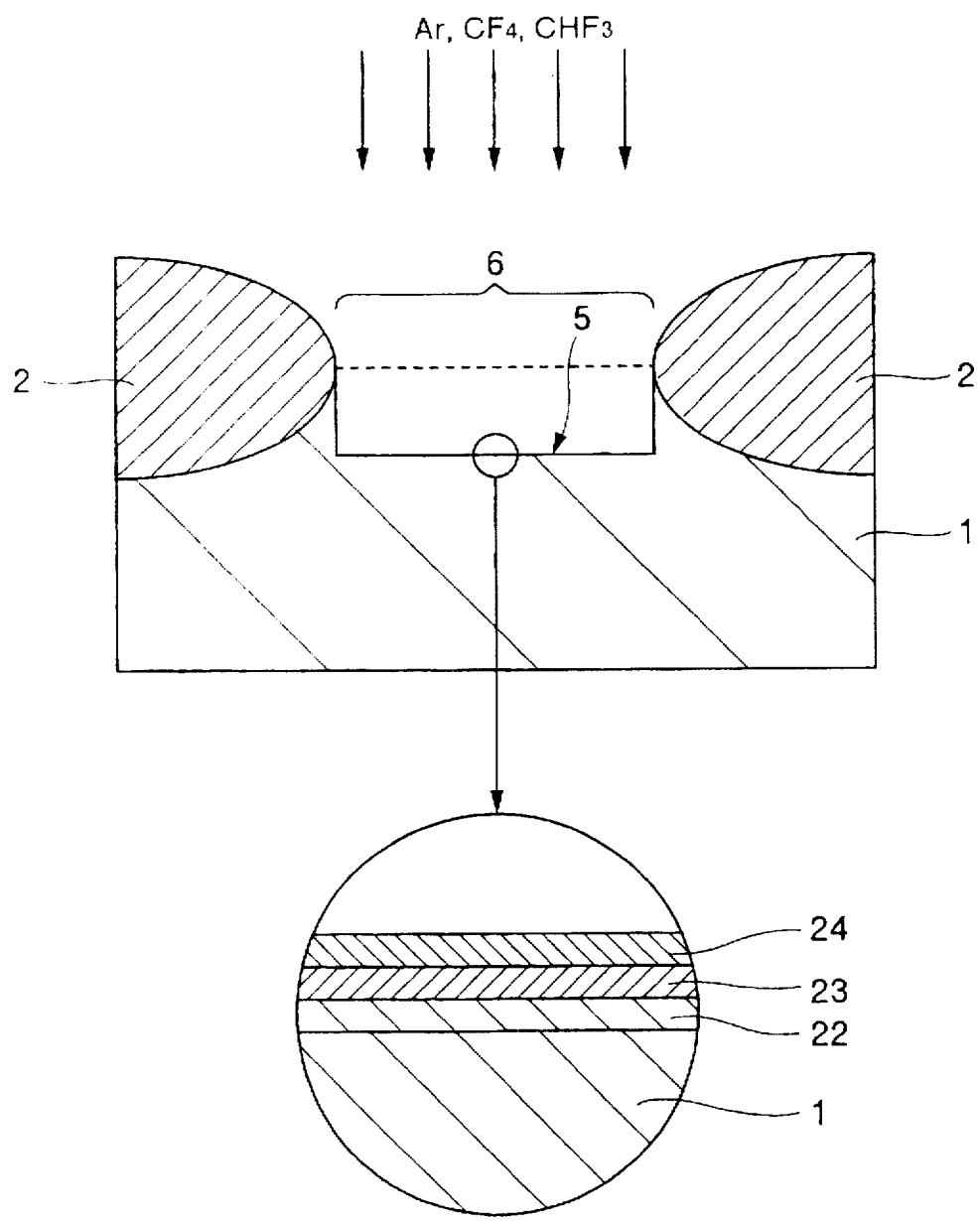

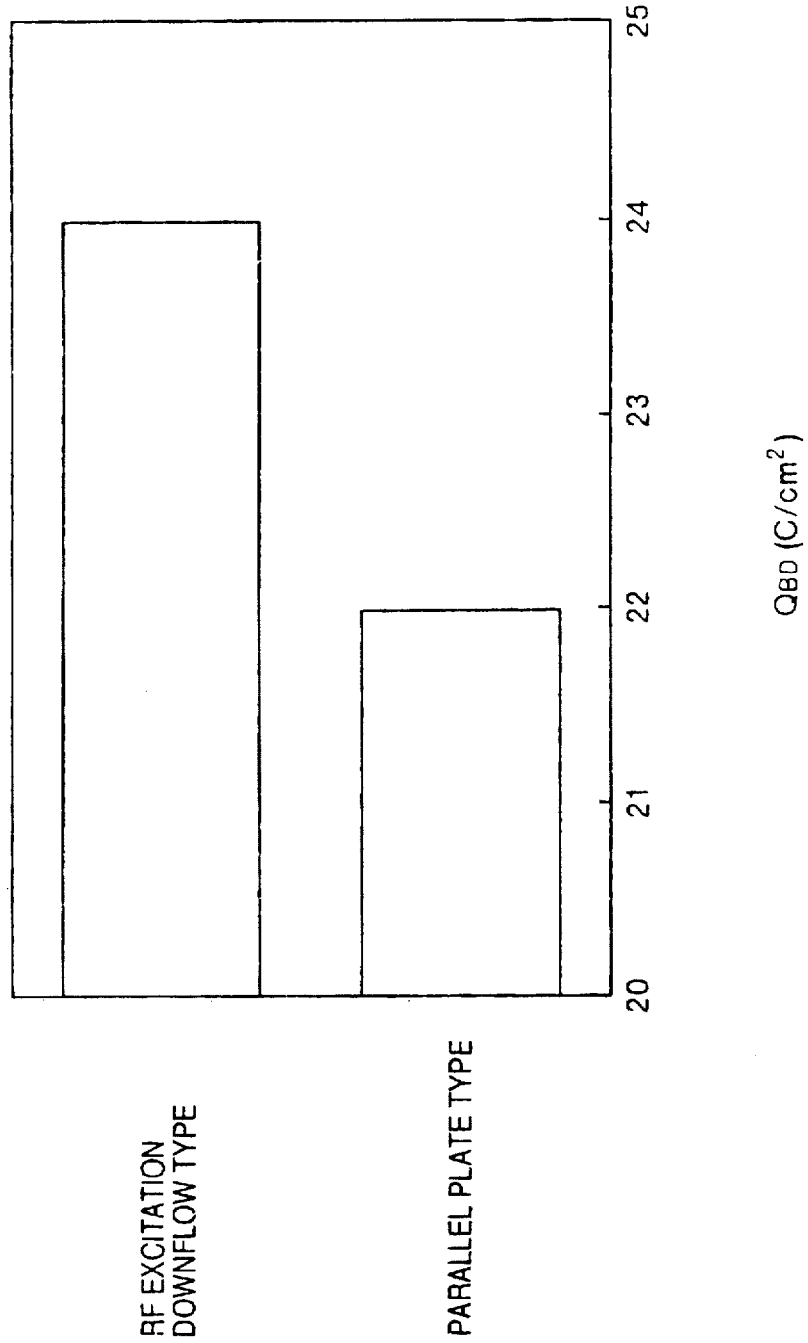

METHOD FOR FABRICATING SEMICONDUCTOR DEVICE

BACKGROUND OF THE INVENTION

1. Field of the Invention

The present invention relates to a method for fabricating a semiconductor device, and in particular to a method for fabricating a semiconductor device suitable for improvement of dielectric strength of semiconductor oxide films such as gate oxide films, and a method for fabricating a three-dimensional semiconductor device of insulated gate type.

2. Description of the Related Art

Element isolation between MOS transistors is typically conducted by forming an insulating film having a large film thickness on the surface of a semiconductor substrate by means of the LOCOS (Local Oxidation of Silicon) method. This LOCOS method includes the steps of selectively forming a silicon nitride film as an oxidation resisting film in a portion on a silicon substrate scheduled to become an element forming region, then performing thermal oxidation on the silicon substrate by using the silicon nitride film as a mask, thereby forming a thick silicon oxide film called field oxide film, and thereafter removing a remaining silicon nitride film by means of wet etching.

In the steps heretofore described, the silicon substrate is not exposed to a plasma atmosphere for dry etching. As elements such as transistors become finer, however, it has become necessary to dig the silicon substrate in an element forming region. In general, therefore, the silicon substrate in the element forming region is subjected to dry etching in a plasma atmosphere of mixed gas containing C (carbon) atoms and F (fluorine) atoms.

When a silicon oxide film deposited on the silicon substrate are to be removed by means of etching so as to leave only the side wall portion of a conductive film, such as when a side wall insulation film is to be formed on the side face of a conductive film formed by patterning in an element forming region, the surface of the silicon substrate is exposed to dry etching in a plasma atmosphere of mixed gas containing C (carbon) atoms and F (fluorine) atoms for a short time in order to detect the end point of etching.

If the surface of the silicon substrate is exposed to dry etching, however, problems described below are caused. The inside of a circle illustrated in FIG. 1 schematically shows the state of the surface of the silicon substrate 1 obtained when the silicon substrate 1 having a field oxide film 2 formed thereon is subjected to plasma processing using gas containing C (carbon) and F (fluorine) atoms. As shown in FIG. 1, in the surface portion of a bottom 5 formed by digging the silicon substrate 1, a silicon damage layer 22 resulting from plasma energy, an SiC layer 23 resulting from reaction of the silicon substrate 1 to carbon atoms contained in the plasma atmosphere, and a CFxSi layer 24 (where x is a natural number) resulting from reaction of the silicon substrate 1 to an etching gas component contained in the plasma atmosphere are formed in order of mention from the bottom layer.

Under such a state that the damage layer 22, the SiC layer 23, and the CFxSi layer 24 are left, a gate oxide layer is formed over these layers 22, 23 and 24 by using the thermal oxidation method. As compared with the case where element forming region 6 is not dug by using dry etching, the film thickness of the gate oxide film becomes thinner resulting in variation of threshold voltages of transistors.

Since carbon atoms and fluorine atoms are taken in from these layers 22, 23 and 24, the dielectric strength of the gate oxide film is significantly reduced.

Therefore, there has been proposed a method for removing the insulation film, which is located at the surface of the silicon substrate, with low damage in forming a metal contact (JP-A-2-151031). Thus, there has been needed a method for performing dry etching on the surface of the silicon substrate without damaging the silicon substrate significantly.

A method for fabricating a three-dimensional semiconductor device of insulated gate type will now be described.

FIG. 2A shows a conventional MOS transistor typically used. For fabricating this MOS transistor, a well 112 is formed in a silicon substrate 111 and thereafter a gate insulating film 113 is formed on a surface of the silicon substrate 111 at an element active region (element forming region). And on the gate insulating film 113, a gate electrode 114 and a side wall 115 (side wall insulating film) of the gate electrode 114 are formed and a pair of high-concentration impurity diffusion layers, i.e. a source 116 and a drain 117 are formed in the well 112.

For improving the degree of integration of a semiconductor integrated circuit device including MOS transistors, it is necessary to make components thereof (i.e. MOS transistors and other elements) finer. However, there is a limit in fine working. In the MOS transistor shown in FIG. 2A, the gate electrode 114 spreads out in parallel to the surface of the silicon substrate 111. This MOS transistor is thus two-dimensional. Therefore, there is also a limit in improvement of degree of integration of the semiconductor integrated circuit device using this MOS transistor.

Therefore, there has been proposed a three-dimensional MOS transistor called SGT (Surrounding Gate Transistor) as shown in FIG. 2B (as in "Technology Trend of High Density Memory" by Shigeyoshi Watanabe, records of SEMI technology symposium 93, pp. 1–17, December 1993).

For fabricating this MOS transistor, a well 212 is formed in a silicon substrate 211 and thereafter a concave portion is formed in the silicon substrate 211 by plasma processing using gas containing carbon atoms. On a side face of a convex portion surrounded by the concave portion, gate insulating films 213 are formed. Then a source 216 and a drain 217 are formed respectively in the bottom of the concave portion and the top of the convex portion by ion implantation. On the gate insulating film 213, a polycrystalline silicon film is formed by patterning to form a gate electrode 214.

In the MOS transistor shown in FIG. 2B, the gate electrode 214 spreads out at right angles to the silicon substrate 211. This MOS transistor is three-dimensional. If this MOS transistor is used, therefore, the degree of integration of the semiconductor integrated circuit device can be improved as compared with the case where the MOS transistor shown in FIG. 2A is used.

FIG. 3 is a Weibull statistic diagram showing the accumulated percent defective of dielectric strength in the case where a silicon oxide film is used as the gate insulating film of a MOS transistor. The axis of abscissas indicates the total charge quantity which can be carried until the gate oxide film breaks down (hereafter referred to as oxide film breakdown charge quantity $Q_{BD}$). The higher the oxide film breakdown charge quantity $Q_{BD}$ is, the more excellent quality the gate oxide film has. The axis of ordinates indicates the accumulated percent defective. It becomes a criterion of performance comparison whether a physical quantity (which is, in this case, the oxide film breakdown charge quantity $Q_{BD}$) obtained when this accumulated percent defective has reached 50% is greater or less.

Data 122 shown in FIG. 3 are data of the two-dimensional MOS transistor illustrated in FIG. 2A. The oxide film breakdown charge quantity $Q_{BD}$ obtained when the accumulated percent defective has reached 50% is approximately 22 C/cm². Data 121 shown in FIG. 13 are data obtained in the case where the gate insulating films 213 are formed immediately on the concave portions formed by plasma processing in the three-dimensional MOS transistor shown in FIG. 2B. The oxide film breakdown charge quantity $Q_{BD}$ obtained when the accumulated percent defective has reached 50% is approximately 0.3 C/cm².

Although the detailed mechanism of deterioration of dielectric strength in the three-dimensional MOS transistor shown in FIG. 2B is not revealed, the following reason can be contemplated. If the silicon substrate 211 undergoes plasma processing using gas containing carbon atoms, Si (silicon) atoms react with C (carbon) atoms during plasma processing and an SiC layer which is a semiconductor is formed on an exposed face of the silicon substrate 211 when plasma processing has been finished. If the gate insulating film 213 is formed while the SiC layer is left as it is, therefore, the dielectric strength of the gate insulating film 213 may be affected.

In forming the three-dimensional MOS transistor as shown in FIG. 2B, therefore, the SiC layer formed on the exposed face of the silicon substrate 211 must be removed by plasma processing in order to make the gate insulating film 213 have a high value of dielectric strength enough to withstand practical use. It is known that this SiC layer can be removed by making the silicon substrate 211 undergo processing using plasma of oxygen gas such as $O_2$ or $O_3$ (as described, for example, in "Silicon surface damage caused by fluorocarbon gas plasma" by Norihiro Ikeda etal, Record of the 45th symposium of semiconductor and integrated circuit technique, pp. 76–81, December 1993).

If plasma processing using oxygen is simply added to the plasma processing for forming the concave portions, however, fine surface roughness called microroughness of the surface of the silicon substrate 211 increases. The increase in microroughness rather degrades the dielectric strength of the gate insulating film 213 significantly (as described, for example, in "Influence surface microroughness on device performance" by Koji Makihara etal, Record of ultraclean technology workshop, pp. 73–91, September 1992). Such degradation of dielectric strength of the gate insulating film 213 degrades reliability of semiconductor devices having MOS transistors significantly.

SUMMARY OF THE INVENTION

A first object of the present invention is to provide a method capable of performing dry etching on the surface of a semiconductor substrate without damaging it significantly and capable of fabricating such a semiconductor device that dielectric strength of a semiconductor oxide film such as a gate oxide film formed thereafter is not lowered and electric characteristics such as threshold voltage are stable.

A second object of the present invention is to provide a fabrication method of a semiconductor device capable of improving the dielectric strength of gate insulating films of MOS transistors formed in the concave portions in three dimensions.

In order to achieve the above described first object, a first fabrication method of a semiconductor device according to the present invention includes first step of etching a semiconductor substrate by using first mixed gas containing carbon atoms and fluorine atoms, second step of etching the semiconductor substrate by using second mixed gas including gas containing fluorine atoms and oxygen gas of partial pressure ratio of at least 70%, and third step of forming a semiconductor oxide film on the semiconductor substrate.

According to the first fabrication method of a semiconductor device, most of a damage layer, an SiC layer, and a CFxSi layer, all of which are formed on the surface of a semiconductor substrate by etching a semiconductor substrate with mixed gas containing carbon atoms and fluorine atoms, are removed by etching the semiconductor substrate with mixed gas including gas containing fluorine atoms and oxygen gas of partial pressure ratio of at least 70%. Therefore, the film thickness of the semiconductor oxide film formed thereafter on the semiconductor substrate becomes thin. Thus electric characteristic parameters such as threshold voltage do not vary. Therefore, it is prevented that carbon atoms and fluorine atoms are taken in the semiconductor oxide film and dielectric strength of the semiconductor oxide film is degraded.

In order to achieve the above described second object, the second fabrication method of a semiconductor device according to the present invention includes first step of applying first plasma processing using first gas containing carbon atoms to a silicon substrate, second step of applying, after the first plasma processing, second plasma processing using second gas containing oxygen gas having a concentration of at least 40% and less than 100% under the condition that a value obtained by dividing the processing pressure (represented by Torr) by the RF power density (W/cm²) becomes at least 0.07 and at most 0.27, and third step of forming, after the second plasma processing, a gate insulating film on an exposed face of the silicon substrate.

According to one aspect of the second fabrication method of a semiconductor device, a concave portion is formed on the silicon substrate by the first plasma processing and the gate insulating film is formed on the side face of the concave portion. The second plasma processing is conducted by a plasma processor of RF excitation downflow type. The processing temperature of the second plasma processing is 200° C. or below.

BRIEF DESCRIPTION OF THE DRAWINGS

FIG. 1 is a diagram illustrating the state of the surface of a silicon substrate obtained when the silicon substrate has undergone etching processing;

FIG. 13 is a graph showing the relation between the type of a plasma processor used to remove an SiC layer in the case where the gate oxide film illustrated in FIG. 2B is a silicon oxide film and dielectric strength of the gate insulating film;

DESCRIPTION OF THE PREFERRED EMBODIMENTS (First Fabrication Method of a Semiconductor Device According to the Present Invention)

Figure 4A:
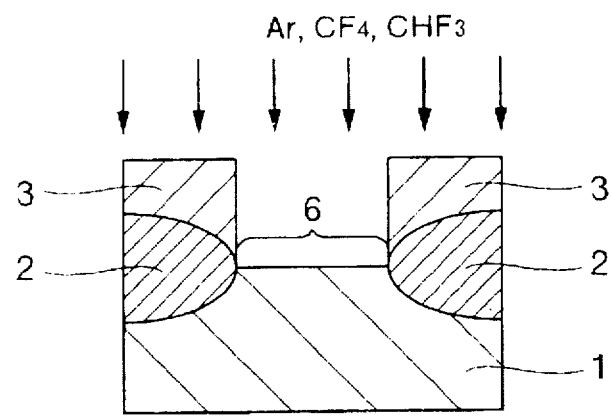
FIGS. 4A through 4D are sectional views showing a first embodiment of a first fabrication method of a semiconductor device according to the present invention in order of steps.

FIGS. 4A through 4D and 5A through 5F are diagrams showing a fabrication method of a MOS transistor in a first embodiment of a first fabrication method of a semiconductor device according to the present invention in order of steps. First of all, a field oxide film 2 is formed at an element isolation region of a silicon substrate 1 by means of a LOCOS method using thermal oxidation as shown in FIG. 4A. Then, the field oxide film 2 is covered by photoresist 3 by using a photlithography technique. Thereafter, the silicon substrate 1 at the element forming region 6 undergoes etching processing in a plasma atmosphere of Ar gas, $CF_4$ gas and $CHF_3$ gas. As for the etching condition at this time, the partial pressure ratio in supplying Ar gas, $CF_4$ gas and $CHF_3$ gas is 40:3:3, the pressure is 1.0 Torr, and processing time is 60 seconds.

Figure 4B:
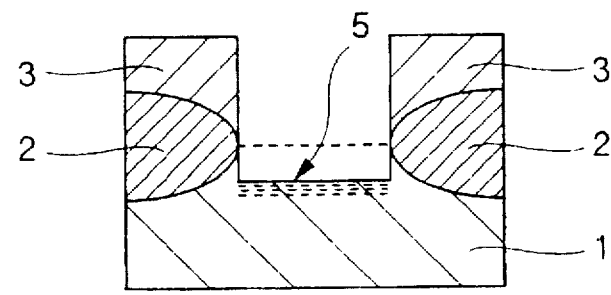

By conducting such etching processing, the silicon substrate 1 at the element forming region 6 is dug as shown in FIG. 4B. In a bottom portion 5 of a trench, a damage layer 22, an SiC layer 23 and a CFxSi layer 24 are formed successively as represented in the circle of FIG. 1.

Figure 4C:
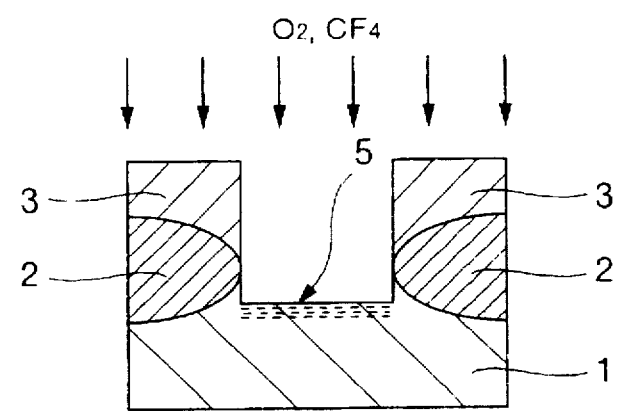

As shown in FIG. 4C, the silicon substrate 1 at the element forming region 6 then undergoes etching processing in a plasma atmosphere of reaction gas $O_2$ and $CF_4$ so that the silicon substrate 1 will be dug by approximately 50 Å. Thereby, most of the damage layer 22, the SiC layer 22 and the CFxSi layer 24 located in the bottom portion 5 is removed. As for the etching condition at this time, the partial pressure of $O_2$ gas is 95.2%, the pressure is 0.8 Torr, and processing time is 15 seconds. In the present embodiment, the dielectric strength yield of a gate oxide film 9 which will be described later was 96%.

Figure 4D:
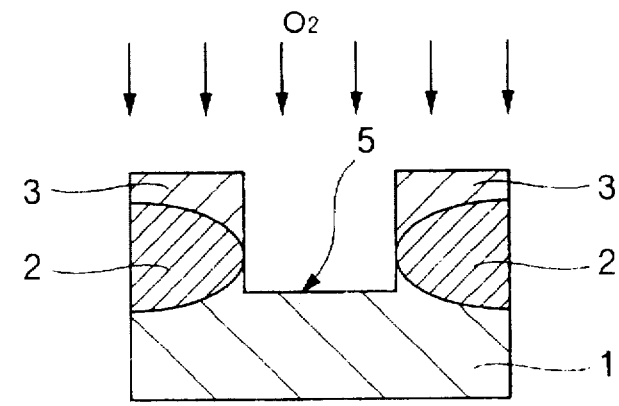
Figure 5A:
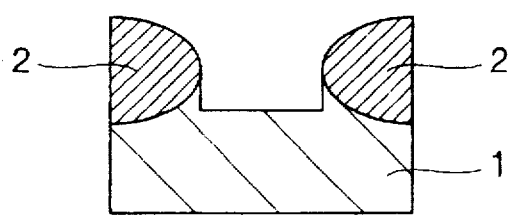
FIGS. 5A through 5F are sectional views showing a first embodiment of a first fabrication method of a semiconductor device according to the present invention in order of steps.
Figure 5D:
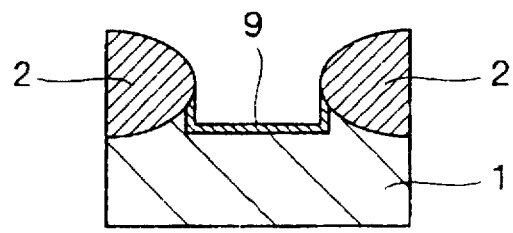

As shown in FIG. 4D, the silicon substrate 1 at the element forming region 6 is subjected to etching processing in an atmosphere of reaction gas $O_2$ under the condition of pressure of 1.0 Torr, microwave power of 800 W, and processing time of 130 seconds. Thereby, the SiC layer 23 and the CFxSi layer 24 left after plasma processing using the reaction gas $O_2$ and $CF_4$ shown in FIG. 4C can be removed. In addition, the photoresist 3 is completely removed as shown in FIG. 5A.

Figure 5B:
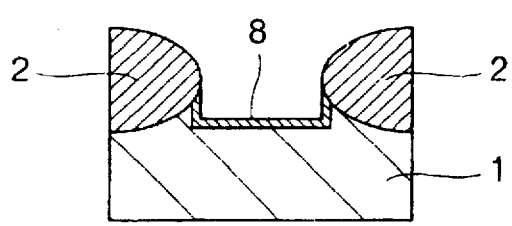

As shown in FIG. 5B, the silicon substrate 1 is then subjected to sulfuric acid cleaning for 15 minutes, SC1 cleaning (cleaning with mixed liquor of ammonia and $H_2O_2$) for 10 minutes, and HF cleaning for 1 minute. Thereafter, the silicon substrate 1 is subjected to pyrojenic oxidation at 800° C. On the surface of the silicon substrate 1 at the element forming region 6, a sacrificial oxide film 8 is thus formed. The sacrificial oxide film 8 is a silicon oxide film having a film thickness of approximately 50 Å. It is said that the film thickness of the sacrificial oxide film 8 should be typically at least 100 Å. In the present embodiment, however, it was confirmed that the damage layer 22 and other layers were sufficiently removed as described later and consequently the effect was produced even if the film thickness of the sacrificial oxide film 8 was approximately 50 Å.

Figure 5E:
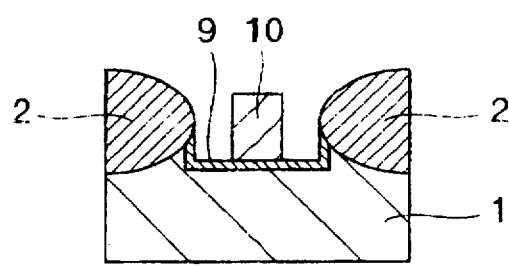
Figure 5C:
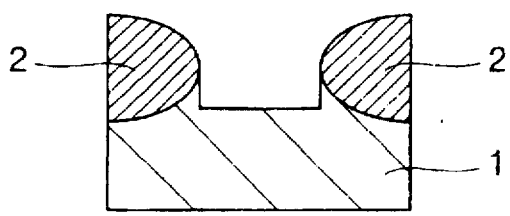

As shown in FIG. 5C, the silicon substrate 1 is then subjected to HF cleaning to remove the sacrificial oxide film 8. Thereafter, pyrojenic oxidation is performed at 800° C. to form a gate oxide film 9 on the surface of the silicon substrate 1 at the element forming region 6. The gate oxide film 9 is a silicon oxide film having a film thickness of approximately 150 Å.

As shown in FIG. 5E, a polysilicon film having a film thickness of approximately 3000 Å and containing impurities is then formed on the gate oxide film 9 by using the CVD method. By selective etching using photoresist (not illustrated), this polysilicon film is patterned in the shape of a gate electrode 10.

Figure 5F:
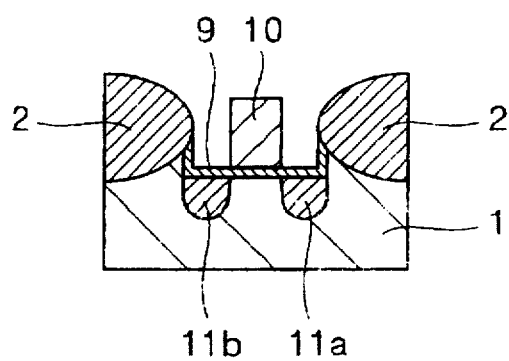

As shown in FIG. 5F, impurity ions having a conductivity type opposite to that of the silicon substrate 1 are implanted by using the gate electrode 10 and the field oxide film 2 as a mask. Thereafter, heat treatment is conducted and a source 11a and a drain 11b are respectively formed on both sides of the gate electrode 10 located on the surface portion of the silicon substrate 1. The source 11a and the drain 11b are impurity diffusion layers. Thereby, a MOS transistor is formed on the silicon substrate 1 at the element forming region 6.

In the MOS transistor fabricated by the steps heretofore described, most of the damage layer 22, the SiC layer 23 and the CFxSi layer 24 has been removed by the etching process using the mixed gas of $O_2$ gas and $CF_4$ gas. Therefore, the film thickness of the gate oxide film 9 is prevented from becoming thinner than that intended. In addition, decrease in dielectric strength of the gate oxide film 9 caused by taking carbon atoms and fluorine atoms from these layers 22, 23 and 24 in the gate oxide film 9 is prevented. Furthermore, electric characteristics such as threshold voltage are very stable.

In the present embodiment, partial pressure ratios of $O_2$ gas and $CF_4$ gas are changed in etching processing (reprocessing) using $O_2$ gas and $CF_4$ gas. The dielectric strength yield of the gate oxide film 9 obtained at this time will now be described by referring to FIG. 6.

Figure 6:
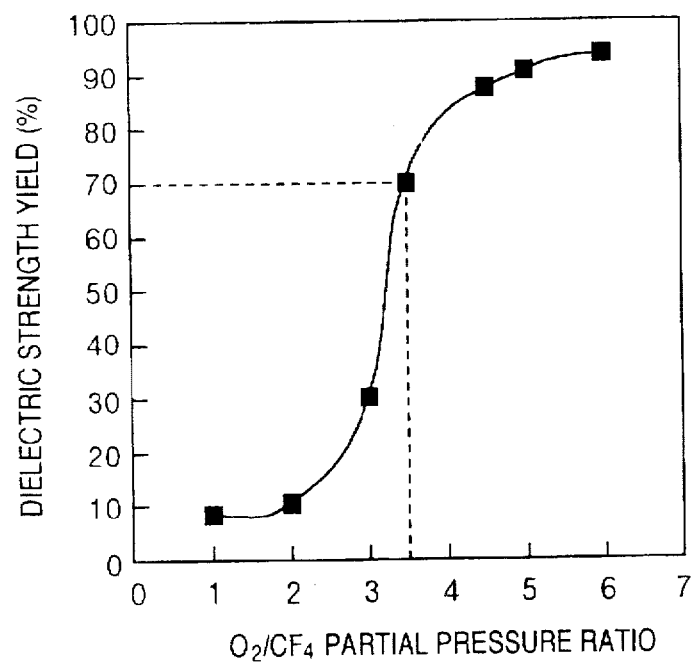
FIG. 6 is a graph showing the relation between the partial pressure ratios of $O_2$ gas and $CF_4$ gas and dielectric strength yield of a gate oxide film in etching processing using $O_2$ gas and $CF_4$ gas.

As shown in FIG. 6, the dielectric strength yield of the gate oxide film 9 increases with an increase in ratio of $O_2$ gas/$CF_4$ gas. When the ratio of $O_2$ gas/$CF_4$ gas is 3.5, the dielectric strength yield of the gate oxide film 9 reaches 70%. For always obtaining stable dielectric strength yield with due regard to influence of process variation, however, it is desired that the ratio of $O_2$ gas/$CF_4$ gas is at least four, i.e., the partial pressure of $O_2$ gas is at least 80%. For example, in the present embodiment, the partial pressure of $O_2$ gas was set equal to 95.2% in etching processing using mixed gas containing $O_2$ gas and $CF_4$ gas. Therefore, the dielectric strength yield of the gate oxide film 9 was 96%. As compared with the case where the silicon substrate 1 was not dug with Ar gas, $CF_4$ gas and $CHF_3$ gas, a decrease in dielectric strength yield was not found.

The relation in the present embodiment between the quantity of cutting of the silicon substrate 1 obtained by etching (reprocessing) using $O_2$ gas and $CF_4$ gas and oxide film breakdown charge quantity $Q_{BD}$ (C/Cm$^2$) capable of passing through unit area of the gate oxide film 9 until the gate oxide film 9 breaks down will now be described by referring to FIG. 7.

Figure 7:
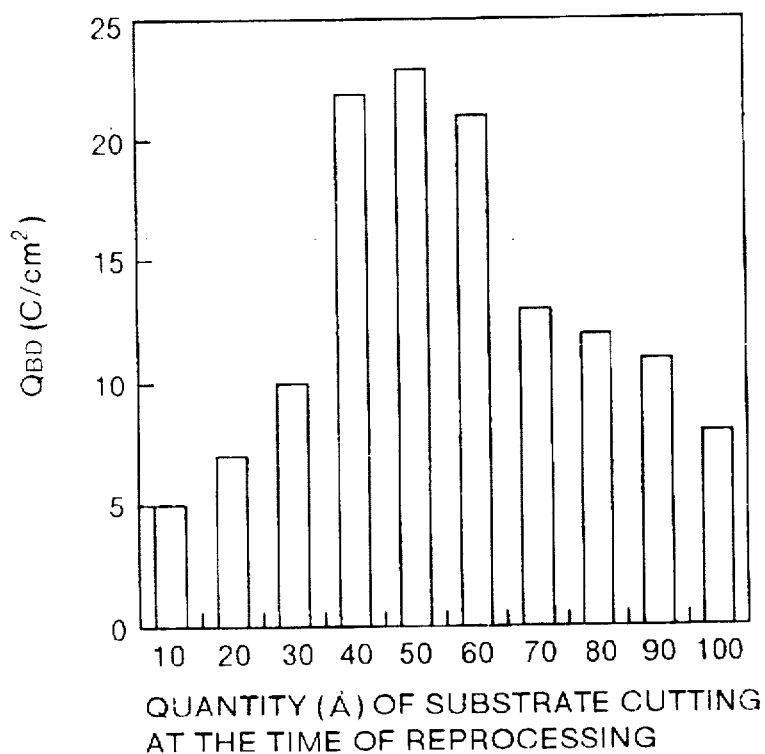
FIG. 7 is a graph showing the relation between the cutting value of a silicon substrate brought about by etching processing using $O_2$ gas and $CF_4$ gas and the oxide film breakdown charge quantity $Q_{BD}$ capable of passing through unit area of a gate oxide film until the gate oxide film breaks down.

As shown in FIG. 7, the oxide film breakdown charge quantity $Q_{BD}$ increases as the quantity of cutting is increased when the quantity of cutting is small. When the quantity of cutting has exceeded approximately 50 Å, the oxide film breakdown charge quantity $Q_{BD}$ decreases as the quantity of cutting is increased. The presumed reason is that the film thickness of the damage layer 22, the SiC layer 23 and the CFxSi layer 24 formed on the silicon substrate 1 at the element forming region 6 is approximately 40 to 60 Å. If this quantity of cutting is less than 40 Å, therefore, a part of the damage layer 22, the SiC layer 23 and the CFxSi layer 24 remains on the silicon substrate 1 and a bad influence is thus exerted upon the dielectric strength of the gate oxide film 9. If the quantity of cutting is greater than 60 Å, the silicon substrate 1 is damaged by plasma excessively and unevenness of the surface thus increases. In this case as well, therefore, dielectric strength is degraded. Considering that it is necessary to secure an oxide film breakdown charge quantity $Q_{BD}$ of at least 20 C/cm$^2$ in order to maintain the reliability of the MOS transistor, it is desirable for practical use that the quantity of cutting is set equal to 40 to 60 Å.

In the present embodiment, the silicon substrate 1 is subjected to etching processing using $O_2$ gas after etching processing (reprocessing) using $O_2$ gas and $CF_4$ gas. This case is referred to as "with $O_2$ processing." Alternatively, the silicon substrate 1 may not be subjected to etching processing using $O_2$ gas ($O_2$ processing) after etching processing (reprocessing) using $O_2$ gas and $CF_4$ gas. This case is referred to as "without $O_2$ processing." A difference between these two cases in oxide film charge quantity $Q_{BD}$ capable of passing through unit area of the gate oxide film 9 until the gate oxide film 9 breaks down will now be described by referring to FIG. 8.

Figure 8:
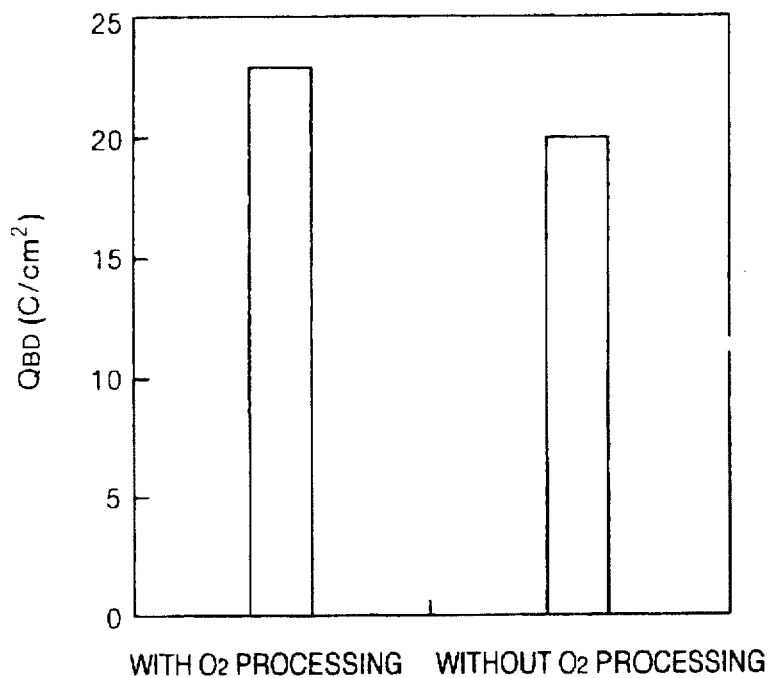
FIG. 8 is a graph showing a result of a comparison made between the oxide film breakdown charge quantity $Q_{BD}$ in the case where a silicon substrate has undergone etching processing using $O_2$ gas after etching processing using $O_2$ gas and $CF_4$ gas and the oxide film breakdown charge quantity $Q_{BD}$ in the case where a silicon substrate has not undergone etching processing using $O_2$ gas.

As shown in FIG. 8, the oxide film breakdown charge quantity $Q_{BD}$ was approximately 23 C/cm$^2$ in the case of "with $O_2$ processing." On the other hand, the oxide film breakdown charge quantity $Q_{BD}$ was approximately 20 C/cm$^2$ in the case of "without $O_2$ processing." By thus effecting $O_2$ processing, the oxide film breakdown charge quantity $Q_{BD}$ increases by approximately 10%. However, there is not a great difference between the two cases. Therefore, the $O_2$ processing may be omitted.

Subsequently, the relation in the present embodiment between the film thickness of the sacrificial oxide film 8 and the oxide film charge quantity $Q_{BD}$ capable of passing through unit area of the gate oxide film 9 until the gate oxide film 9 breaks down will now be described by referring to FIG. 9.

Figure 9:
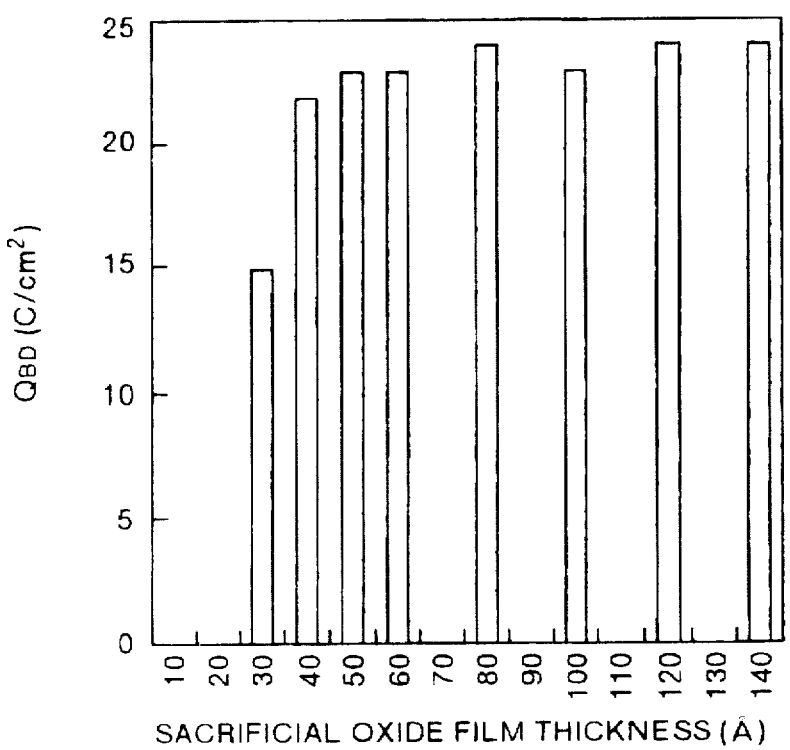
FIG. 9 is a graph showing the relation between the film thickness of a sacrificial oxide film and the oxide film breakdown charge quantity $Q_{BD}$.

If the film thickness of the sacrificial oxide film 8 is at least 40 Å, the oxide film charge quantity $Q_{BD}$ of at least 20 C/cm$^2$ needed to maintain the reliability of the MOS transistor can be ensured as evident from FIG. 9. By using the present embodiment method, therefore, the film thickness of the sacrificial oxide film which must be typically at least 100 Å can be made extremely thin.

A second embodiment of the first fabrication method of a semiconductor device according to the present invention will now be described by referring to FIGS. 10A through 10D and 11A through 11C. In etching back the silicon oxide film deposited on the silicon substrate to form a side wall oxide film of a field shield gate electrode, the surface of the silicon substrate in the present embodiment is subjected to dry etching for a short time in order to detect the end point of etching. By the way, the field shield gate electrode is an electrode for keeping the potential of this electrode constant by means of grounding, for example, and thereby performing element isolation. In recent years, the field shield gate electrode is used for element isolation instead of the LOCOS method (as described in JP-A-6-291276).

Figure 10A:
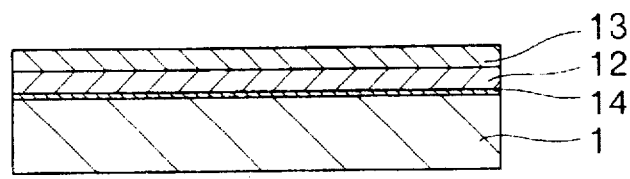
FIGS. 10A through 10D are sectional views showing a second embodiment of a first fabrication method of a semiconductor device according to the present invention in order of steps.

First of all, a shield gate oxide film 14 having a film thickness of approximately 400 Å is formed on a silicon substrate 1 by thermal oxidation at 900° C. as shown in FIG. 10A. Furthermore, a polysilicon film 12 containing impurities and having a film thickness of approximately 3000 Å is formed by using the CVD method. Thereafter, a silicon oxide film 13 having a film thickness of approximately 2000 Å is formed on the polysilicon film 12 by using the CVD method.

Figure 10B:
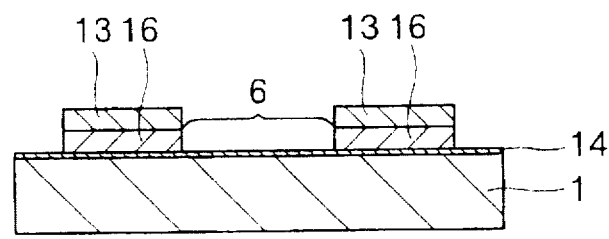

As shown in FIG. 10B, the silicon oxide film 13 at the element forming region 6 is then removed selectively by etching. Thereafter, the polysilicon film 12 at the element forming region 6 is selectively removed by etching. Thereby, a field shield gate electrode 16 including the polysilicon film 12 is formed in the element isolation region.

Figure 10C:
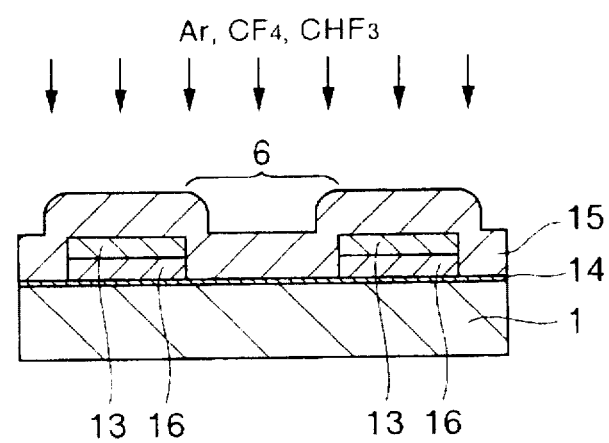

As shown in FIG. 10C, a silicon oxide film 15 having a film thickness of approximately 3500 Å is then formed on the whole surface of the silicon substrate 1 by using the CVD method. Thereafter, the silicon oxide film 15 and the shield gate oxide film 14 at the element forming region 6 are subjected to etching processing (etching back) in a plasma atmosphere of Ar gas, $CF_4$ gas and $CHF_3$ gas. The etching condition at this time are as follows: partial pressure ratio in supplying Ar gas, $CF_4$ gas and $CHF_3$ gas is 40:3:3; the pressure is 1.0 Torr; and the processing time is 30 seconds.

Figure 10D:
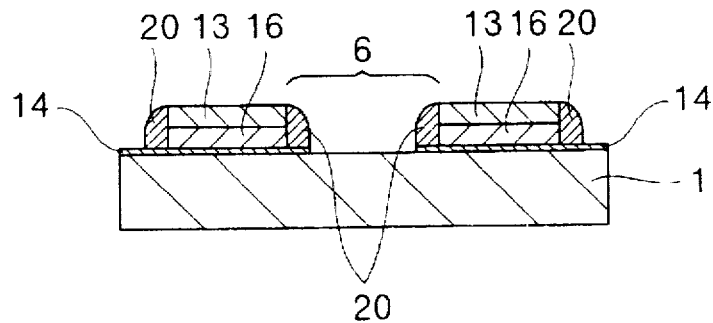

By conducting such etching processing, the silicon oxide film 15 remains on side faces of the field shield gate electrodes 16 as shown in FIG. 10D. Side wall oxide films 20 each including the silicon oxide film 15 are thus formed. In this etching, the end point is detected by using the silicon substrate 1 at the element forming region 6. Therefore, the silicon substrate 1 is exposed to mixed gas containing Ar gas, $CF_4$ gas and $CHF_3$ gas for a short time. In the same way as the above described first embodiment, a damage layer 22, an SiC layer 23 and a CFxSi layer 24 as shown in FIG. 1 are formed on the surface of the silicon substrate 1 at the element forming region 6.

Figure 11A:
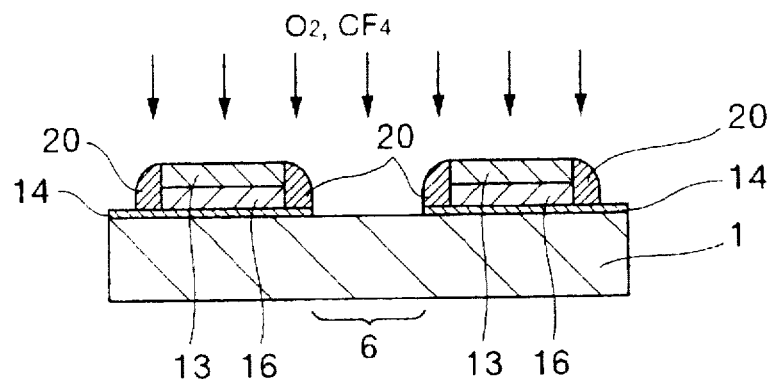
FIGS. 11A through 11C are sectional views showing a second embodiment of a first fabrication method of a semiconductor device according to the present invention in order of steps.

As shown in FIG. 11A, the silicon substrate 1 at the element forming region 6 is then etched by approximately 150 Å in a plasma atmosphere containing reaction gas $O_2$ and $CF_4$. Thereby, most of the damage layer 22, the SiC layer 23 and the CFxSi layer 24 on the surface of the silicon substrate 1 is removed. The etching condition at this time are as follows: partial pressure ratio of $O_2$ gas is at least 80%, the pressure is 0.8 Torr; and the processing time is 15 seconds.

Figure 11B:
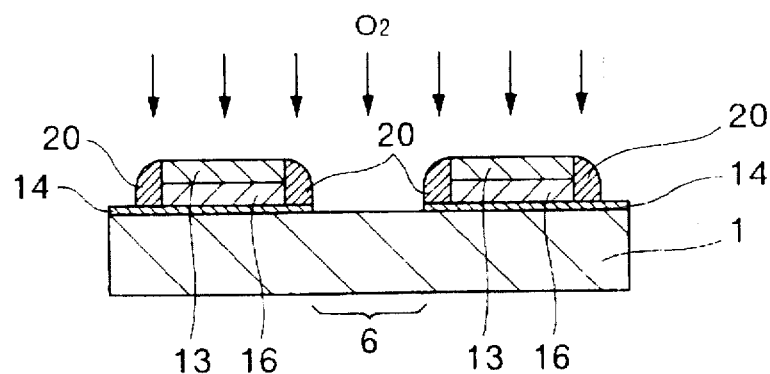

As shown in FIG. 11B, the silicon substrate 1 at the element forming region 6 is then subjected to etching processing in an atmosphere of reaction gas $O_2$ under the condition that the pressure is 1.0 Torr and the processing time is 130 seconds. Thereby, the SiC layer 23 and the CFxSi layer 24 left after the plasma processing using reaction gas of $O_2$ and $CF_4$ as shown in FIG. 11A can be removed.

Figure 11C:
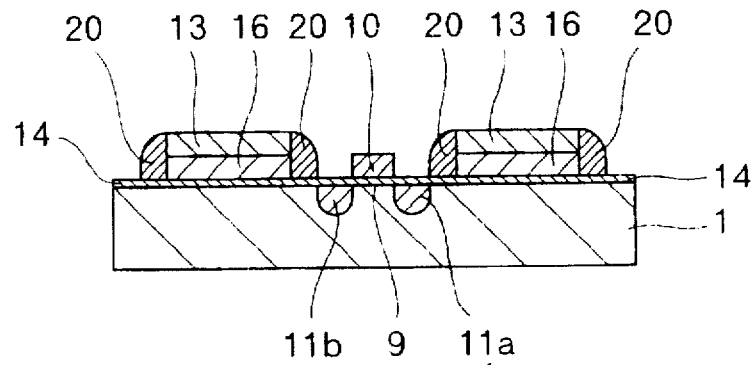

By subsequently executing steps similar to those of the first embodiment shown in FIGS. 5B through 5F, a MOS transistor as shown in FIG. 11C can be formed on the silicon substrate 1. The MOS transistor includes a gate electrode 10 on the gate oxide film 9 and a source 11a and a drain 11b. The source 11a and the drain 11b are impurity diffusion layers located on both sides of the gate electrode 10.

In the MOS transistor fabricated by steps of the present embodiment, most of the damage layer 22, the SiC layer 23 and the CFxSi layer 24 is removed by etching processing using mixed gas containing $O_2$ gas and $CF_4$ gas. Therefore, the film thickness of the gate oxide film 9 is prevented from becoming thinner than that designed. Since the threshold voltage of the MOS transistors thus varies little, electric characteristics become very stable. Furthermore, it is prevented that carbon atoms and fluorine atoms from these layers 22, 23 and 24 are taken in the gate oxide film 9 and dielectric strength of the gate oxide film 9 is degraded. In the present embodiment as well, the dielectric strength of the gate oxide film 9 of at least 80% could be assured.

By the way, the first fabrication method of a semiconductor device according to the present invention can be used not only for improving the dielectric strength and electric characteristics of the gate oxide film of the MOS transistor as in the above described first and second embodiments, but also for improving the dielectric strength and electric characteristics of a tunnel oxide film of a nonvolatile semiconductor device such as EEPROM.

In the first fabrication method of a semiconductor device according to the present invention as heretofore described, the damage layer, SiC layer and CFxSi layer formed on the surface of the semiconductor substrate by etching the semiconductor substrate with mixed gas containing carbon atoms and fluorine atoms are almost removed by etching the semiconductor substrate with mixed gas including gas containing fluorine atoms and oxygen gas having a partial pressure ratio of at least 70%. Therefore, it is prevented that the film thickness of the semiconductor oxide film formed on the semiconductor substrate thereafter becomes thin and thereby the threshold voltage varies. Thus the electric characteristics are stabilized. In addition, it is prevented that carbon atoms and fluorine atoms are taken in the semiconductor oxide film and consequently the dielectric strength of the semiconductor oxide film is degraded. Therefore, semiconductor devices having better perfomance can be obtained.

In the above described first embodiment, the silicon substrate 1 at the element forming region 6 is etched by using mixed gas containing Ar gas, $CF_4$ gas and $CHF_3$ gas as "mixed gas containing carbon atoms and fluorine atoms." Alternatively, the silicon substrate 1 at the element forming region 6 may be etched by using mixed gas containing $C_2F_6$ gas or $C_4F_8$ gas as "mixed gas containing carbon atoms and fluorine atoms." In the first embodiment, the silicon substrate 1 at the element forming region 6 is etched by using mixed gas containing $CF_4$ gas and $O_2$ gas as "mixed gas including gas containing fluorine atoms and oxygen gas having a partial pressure ratio of at least 70%." Alternatively, the silicon substrate 1 at the element forming region 6 may be etched by using mixed gas containing $CHF_3$ gas, $C_2F_6$ gas or $C_4F_8$ gas, and $O_2$ gas as "mixed gas including gas containing fluorine atoms and oxygen gas having a partial pressure ratio of at least 70%."

Similarly, in the above described second embodiment, the silicon oxide film 15 is etched by using mixed gas containing Ar gas, $CF_4$ gas and $CHF_3$ gas as "mixed gas containing carbon atoms and fluorine atoms." Alternatively, the silicon oxide film 15 may be etched by using mixed gas containing $C_2F_6$ gas or $C_4F_8$ gas as "mixed gas containing carbon atoms and fluorine atoms." In the second embodiment, the silicon substrate 1 at the element forming region 6 is etched by using mixed gas containing $CF_4$ gas and $O_2$ gas as "mixed gas including gas containing fluorine atoms and oxygen gas having a partial pressure ratio of at least 70%." Alternatively, the silicon substrate 1 at the element forming region 6 may be etched by using mixed gas containing $CHF_3$ gas, $C_2F_6$ gas or $C_4F_8$ gas, and $O_2$ gas as "mixed gas including gas containing fluorine atoms and oxygen gas having a partial pressure ratio of at least 70%."

(Second Fabrication Method of a Semiconductor Device According to the Present Invention)

A fabrication method of a three-dimensional MOS transistor using an embodiment of a second fabrication method of a semiconductor device according to the present invention will now be described by referring to FIGS. 12A through 12D.

Figure 12A:
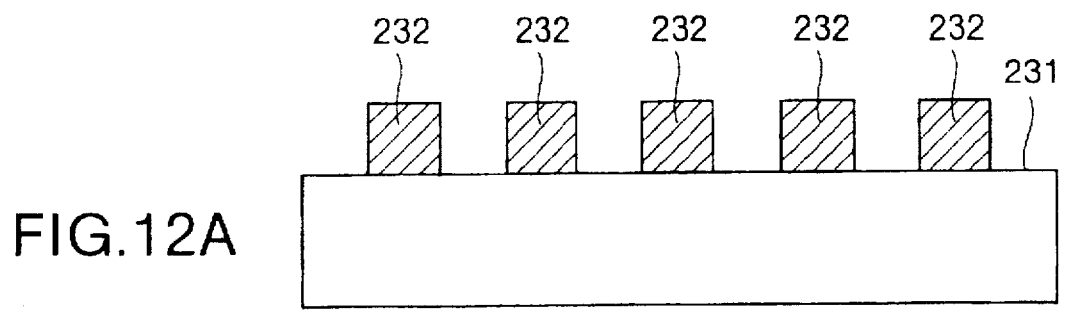
FIGS. 12A through 12D are sectional views showing an embodiment of a second fabrication method of a semiconductor device according to the present invention in order of steps.

On a silicon substrate 231 after a well (not illustrated) has been formed, a photoresist 232 patterned so as to have a side length of 1 μm is first formed by using the lithography technique as shown in FIG. 12A.

Figure 12B:
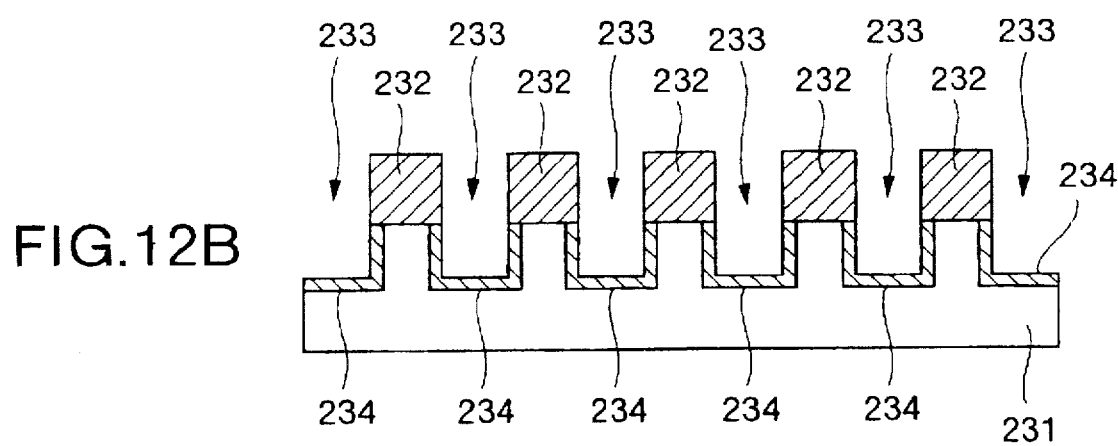

Subsequently as shown in FIG. 12B, the silicon substrate 231 is subjected to dry etching using the photoresist 232 as a mask, under the condition of processing pressure of 1.0 Torr and RF power of 300 W. At this time, a parallel plate plasma processing system is used. And mixed gas having the ratio of $CF_4$ gas:$CHF_3$ gas:Ar gas=3:3:40 is used, for example. By this plasma processing (first plasma processing), concave portions 233 each having a depth of 1 μm are formed in the silicon substrate 231. Simultaneously therewith, SiC layers 234 are formed on the exposed faces of the silicon substrate 231 as a result of combinining of carbon atoms with silicon atoms. As for the etching gas, HBr or other halogen gas may be used instead of $CF_4$ gas or $CHF_3$ gas so long as it contains at least carbon atoms.

Figure 12C:
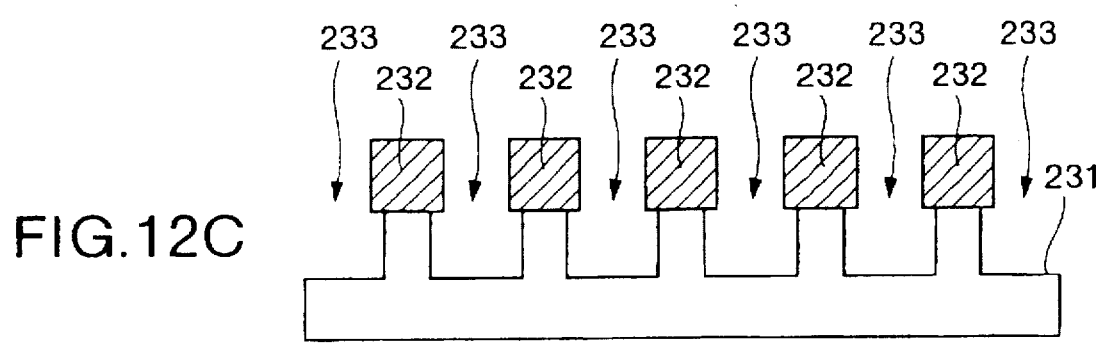

Subsequently as shown in FIG. 12C, the silicon substrate 231 is subjected to plasma processing (second plasma processing), under the condition of processing pressure of 0.8 Torr, microwave power of 800 W and processing temperature of 150° C. At this time, a microwave excitation downflow plasma processing system which is one kind of RF (Radio Frequency) excitation downflow plasma processing system is used. And, mixed gas having the ratio of $O_2$ gas:$CF_4$ gas=20:1 is used. By this plasma processing, the SiC layers 234 are oxidized by a large quantity of oxygen gas to form $SiO_2$ films. And, this $SiO_2$ films are removed by $CF_4$ gas. Eventually, therefore, the SiC layers 234 are removed by plasma processing.

Figure 12D:
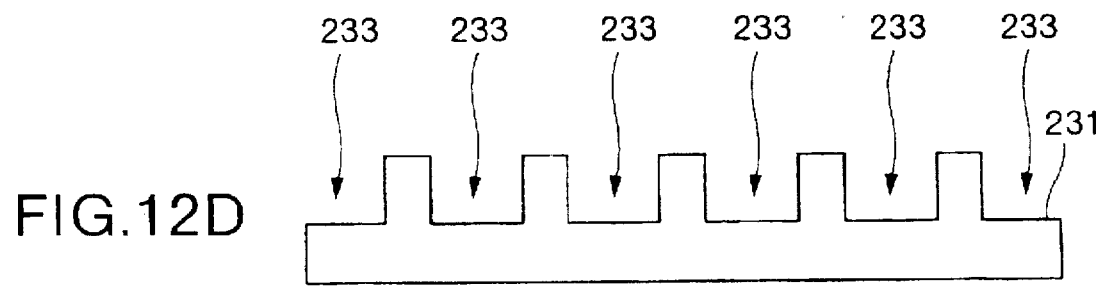

Subsequently, as shown in FIG. 12D, the photoresists 232 are ashed and removed in plasma processing of arbitrary conditions using $O_2$ gas. Thereafter, a cleaning step is executed. As shown in FIG. 2B, a gate insulating film 213 and a gate electrode 214 are formed on side faces of each of the concave portions 233 to fabricate a three-dimensional SGT MOS transistor.

Subsequent fabrication steps of the MOS transistor will now be described by referring to FIG. 2B.

First of all, the gate insulating film 213 is formed by using the thermal oxidation method. By ion implantation, a source 216 and a drain 217 are then formed on the bottom of each of the concave portions 233 and on the top of each of convex portions, respectively.

On the whole surface of the gate insulating film 213, a polycrystal silicon film is then formed. By etching back this polycrystal silicon film, the gate electrode 214 including the polycrystal silicon film is formed only on the side face of each of the concave portions 233. By this etch-back step, the gate insulating film 213 located on the top of each of the convex portions is simultaneously removed. Thereafter, a high-concentration impurity diffusion layer may be formed on the surface of the silicon substrate 212 by using the convex portions and the gate electrodes 214 as a mask and conducting ion implantation on the concave portions 233.

In the implementation forms heretofore described, plasma processing shown in FIG. 12B has been conducted by the parallel plate plasma processing system. Alternatively, it may be conducted by the microwave excitation downflow plasma processing system in the same way as the plasma processing shown in FIG. 12C.

As the RF excitation downflow plasma processing system, the ECR plasma processing system may also be used besides the microwave excitation downflow plasma processing system.

Figure 2A:
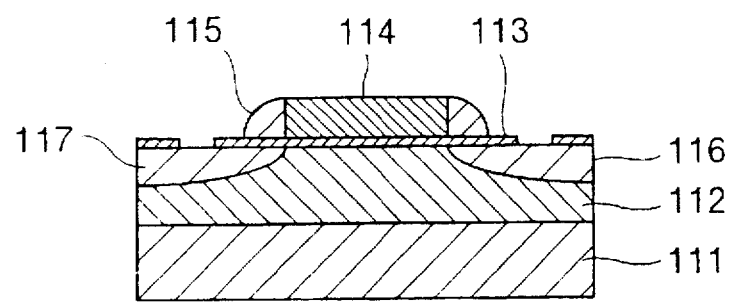
FIGS. 2A and 2B are sectional views illustrating a two-dimensional MOS transistor and a three-dimensional MOS transistor, respectively.
Figure 2B:
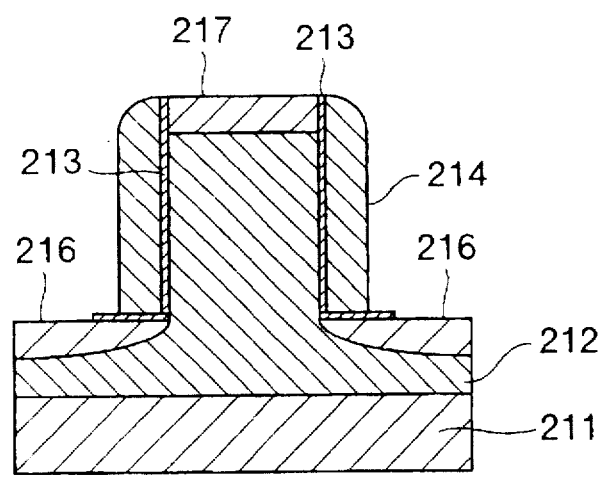
Figure 3:
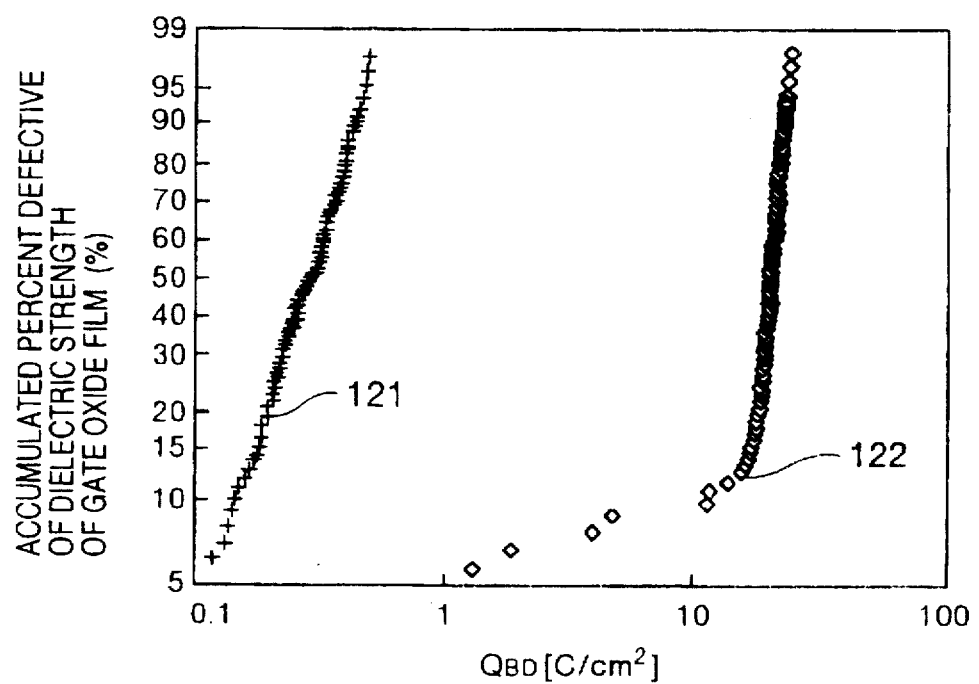
FIG. 3 is a graph illustrating deterioration of insulation of a gate oxide film caused by conducting plasma processing on a silicon substrate by using gas containing carbon atoms.

While in the present implementation form a three-dimensional MOS transistor of SGT type as shown in FIG. 2B has been fabricated, it is also applicable to fabrication of a two-dimensional MOS transistor as shown in FIG. 2A.

The case where the condition of the second plasma processing is varied in various ways will now be described by referring to FIGS. 13 through 16.

FIG. 13 shows the relation between the type of the plasma processor used to remove the SiC layer 234 in the case where the gate oxide film 213 is a silicon oxide film and the oxide film breakdown charge quantity $Q_{BD}$ at the time when the accumulated percent defective of dielectric strength has reached 50%. It is evident from FIG. 13 that the oxide film breakdown charge quantity $Q_{BD}$ in the case where the RF excitation downflow plasma processing system is used ($Q_{BD}$=approximately 24 C/cm$^2$) is greater than $Q_{BD}$ in the case where the parallel plate plasma processing system is used ($Q_{BD}$=approximately 22 C/cm$^2$). In removing the SiC layer 234, the RF excitation downflow plasma processing system is thus more excellent.

A considerable reason why the RF excitation downflow plasma processing system is excellent as the processor for conducting the second plasma processing is that damage inflicted on the silicon substrate 231 can be suppressed to the minimum by using this processor.

The structure of ECR plasma processing system will now be described. The ECR plasma processing system is one kind of RF excitation downflow plasma processing system.

Figure 14:
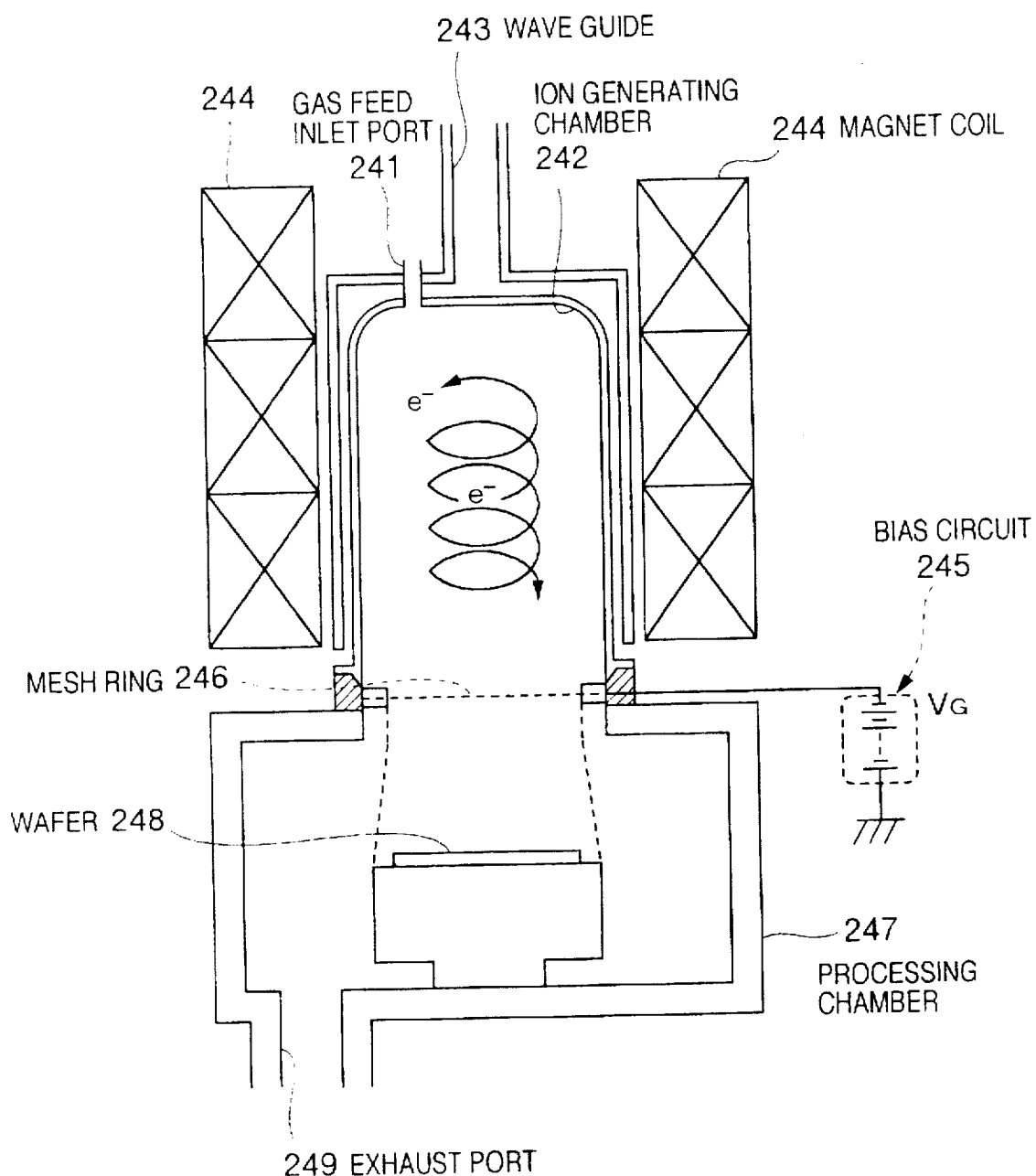
FIG. 14 is a schematic diagram of an ECR plasma processing system which is one kind of plasma processor of RF excitation downflow type.

In the ECR plasma processing system, gas to be used for etching is led from a gas feed inlet port 241 to an ion generation chamber 242 as shown in FIG. 14. By interaction between the RF wave led in from a waveguide 243 and a magnet coil 244 disposed so as to surround the ion generation chamber 242, the gas becomes highly ionized plasma.

The kinetic energy of this plasma is controlled in an external bias circuit 245 by a mesh ring 246 controlled so as to have an arbitrary potential. Thereafter, a wafer 248 disposed in a processing chamber 247 is subjected to plasma processing. In order to always supply fresh plasma to the surface of the wafer 248, the inside of the processing chamber 247 is exhausted through an exhaust port 249 by a pump.

Figure 15:
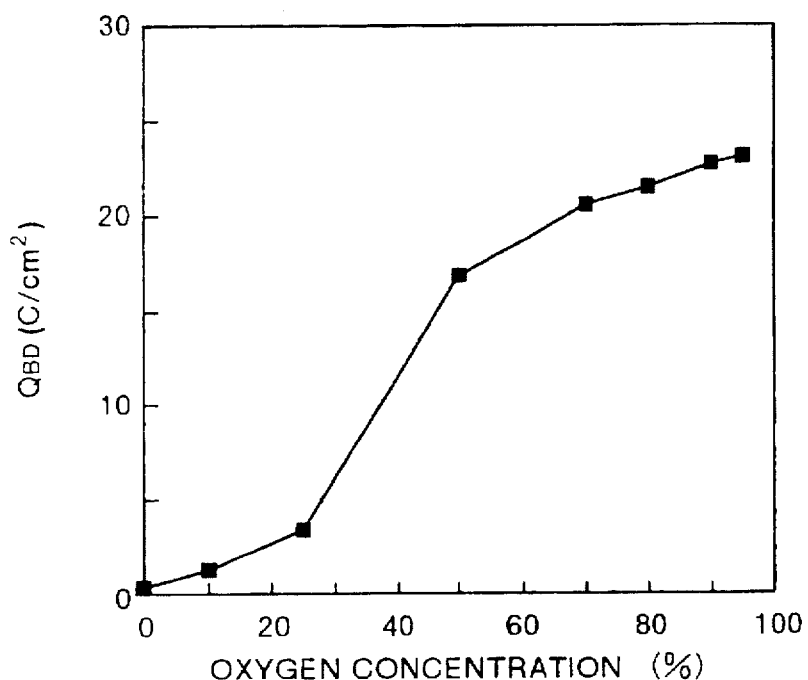
FIG. 15 is a graph showing the relation between the oxygen concentration in gas used to remove the SiC layer and dielectric strength of a gate insulating film.

It is now assumed that the gate insulating film 213 is a silicon oxide film and a microwave excitation downflow plasma processing system is used. Further assuming that plasma processing using mixed gas of $O_2$ gas and $CF_4$ gas is conducted for 10 seconds in order to remove the SiC layer 234, FIG. 15 shows the relation between the concentration of $O_2$ gas (oxygen concentration) and the oxide film breakdown charge quantity $Q_{BD}$ obtained when the accumulated percent defective of dielectric strength has reached 50%. Conditions of plasma processing are as follows: processing pressure is 0.8 Torr, microwave power is 800 W, and processing temperature is 150° C.

When the oxygen concentration is extremely low, the oxide film breakdown charge quantity $Q_{BD}$ is improved little as evident from FIG. 15 even if plasma processing is conducted. Because the SiC layer 234 is not removed even if plasma processing is conducted. When the oxygen concentration exceeds approximately 40%, the oxide film breakdown charge quantity $Q_{BD}$ is significantly improved. It will be appreciated that oxygen concentration of at least 90% is necessary in plasma processing for making the oxygen film breakdown charge quantity $Q_{BD}$ stable at approximately 22 C/cm$^2$.

For always obtaining the stable oxygen film breakdown charge quantity $Q_{BD}$ of at least 22 C/cm$^2$, it is thus desired that the oxygen concentration is at least 90%. In the case where SiC cannot be completely oxidized by oxygen gas alone, however, SiC remains and $CF_4$ gas for etching $SiO_2$ is not present. Therefore, it is desired that the oxygen concentration is less than 100%.

It is now assumed that the gate insulating film 213 is a silicon oxide film and a microwave excitation downflow plasma processing system is used. Further assuming that the second plasma processing for removing the SiC layer 234 is conducted under the condition that $O_2$ gas:$CF_4$ gas=20:1, the processing time is 8 seconds, and the processing temperature is 200° C., FIG. 16 shows the relation between the value (hereafter referred to as P/P ratio) obtained by dividing the pressure (Torr) of plasma processing by microwave power density (W/cm$^2$) and the defect density of the silicon oxide film.

Figure 16:
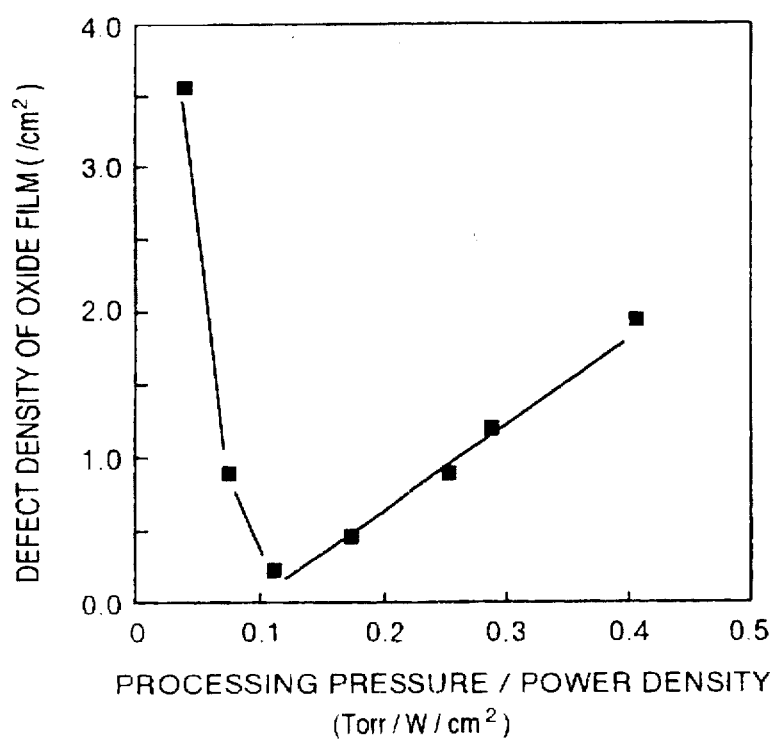
FIG. 16 is a graph showing the relation among the processing pressure used to remove the SiC layer, power density, and dielectric strength of a gate insulating film.

It is appreciated from FIG. 16 that the defect density of the silicon oxide film is correlative to the P/P ratio. The defect density of practical silicon oxide films is at most 1.0 /cm$^2$. If plasma processing is conducted with the P/P ratio ranging from 0.07 to 0.27, therefore, a practical silicon oxide film can be obtained. If the P/P ratio is located outside of this range, however, the defect density of the silicon oxide film increases significantly and the fabrication yield is reduced. Therefore, it is appreciated that the optimum P/P ratio in plasma processing for removing the SiC layer 234 is in the range of 0.07 to 0.27.

It is now assumed that plasma processing for removing the SiC layer 234 is conducted under the condition that $O_2$ gas:$CF_4$ gas=20:1, the processing time is 8 seconds, the processing pressure is 0.8 Torr, and the microwave power is 800 W. TABLE 1 shows the plasma processing temperature, the range of processing time taken for the oxide film breakdown charge quantity $Q_{BD}$ obtained when the accumulated percent defective of dielectric strength has reached 50% to become at least 22 C/cm$^2$, and the range of optimum processing time.

TABLE 1

| Plasma processing temperature | Processing time for $Q_{BD}$ = 22 or more | Optimum processing time | $Q_{BD}$ at the time of optimum processing |
| --- | --- | --- | --- |
| 50° C. | 30 to 40 seconds | 10 seconds | 22–23C/cm² |
| 150° C. | 9 ± 2 seconds | 4 seconds | 22–23C/cm² |
| 200° C. | 6 ± 1 seconds | 2 seconds | 22–23C/cm² |
| 250° C. | 3.0 to 3.5 seconds | 0.5 seconds | 22–23C/cm² |

If a processing time other than the optimum processing time shown in TABLE 1 is used, the dielectric strength of the gate insulating film 213 is not improved. Specifically, if the processing time is short, the SiC layer 234 is not completely removed. If the processing time is long, microroughness on the exposed face of the silicon substrate 231 increases. In both cases, therefore, the oxide film breakdown charge quantity $Q_{BD}$ becomes less than 22 C/cm² and consequently the dielectric strength of the gate insulating film 213 is not improved.

As apparent from TABLE 1, the optimum processing time becomes shorter as the plasma processing temperature is raised. When the plasma processing temperature is 200° C., the optimum processing time is approximately 2 seconds. When the plasma processing temperature is 250° C., the optimum processing time is at most 1 second. Furthermore, if the plasma processing temperature is raised, the processing time taken for the oxide film breakdown charge quantity $Q_{BD}$ to become at least 22 C/cm² also becomes shorter. When the plasma processing temperature is 200° C., the processing time is approximately 6 seconds. When the plasma processing temperature is 250° C., the processing time is approximately 3 seconds. On the other hand, in the plasma processor, it takes approximately 2 seconds from the processing start for plasma to become stable. Considering that stable processing cannot be conducted in removal of the SiC layer 234 if plasma processing temperature exceeds 200° C., therefore, it is desired that plasma processing temperature is 200° C. or below.

In the above described second fabrication method of a semiconductor device according to the present invention, the first plasma processing is conducted on a silicon substrate and an SiC layer which is a semiconductor layer formed on the exposed face of the silicon substrate by the first plasma processing is removed by the second plasma processing. In the first plasma processing, concave portions may be formed on the surface of the silicon substrate.

The oxygen concentration of gas used in this second plasma processing is at least 40% and less than 100%. Without increasing microroughness, therefore, the SiC layer can be removed efficiently and a gate insulating film having a great value of oxide film breakdown charge quantity $Q_{BD}$ can be formed. Furthermore, the value obtained by dividing the processing pressure (Torr) in the second plasma processing by RF power density (W/cm²) is at least 0.07 and is at most 0.27. Therefore, a practical gate insulating film reduced in defect density can be formed.

Furthermore, in the case where the second plasma processing is conducted by using a RF excitation downflow plasma processing system, damage inflicted on the silicon substrate can be suppressed to the minimum. A gate insulating film having a great value of the oxide film breakdown charge quantity $Q_{BD}$, which is the total charge quantity capable of flowing until breakdown occurrs, can be formed.

Furthermore, in the case where processing temperature in the second plasma processing is set equal to 200° C. or below, the plasma processing time for obtaining a gate insulating film having a great value of the oxide film breakdown charge quantity $Q_{BD}$ can be secured sufficiently. Therefore, a gate insulating film having a great value of the oxide film breakdown charge quantity $Q_{BD}$ can be formed stably.

By using the second fabrication method of a semiconductor device according to the present invention, therefore, a gate insulating film having excellent dielectric strength and good quality can be formed in forming elements such as MOS transistors disposed in three dimensions. Semiconductor devices formed with high reliability can be thus fabricated.

In the above described embodiment, the second plasma processing has been conducted by using mixed gas containing $O_2$ gas and $CF_4$ gas as "mixed gas containing oxygen having a concentration of at least 40% and less than 100%." Alternatively, the second plasma processing may be conducted by using mixed gas containing $O_2$ gas and $CHF_3$ gas, $C_2F_6$ gas or $C_4F_8$ gas as "mixed gas containing oxygen having a concentration of at least 40% and less than 100%."

What is claimed is:

1. A fabrication method of a semiconductor device, said fabrication method comprising:

first step of etching a semicondutor substrate by using first mixed gas containing carbon atoms and fluorine atoms;

second step of etching said semiconductor substrate subjected to said first step, by using second mixed gas including gas containing fluorine atoms and oxygen gas having a partial pressure ratio equivalent to at least 70%, and third step of forming a semiconductor oxide film on said semiconductor substrate.

2. A fabrication method of a semiconductor device according to claim 1, wherein said first mixed gas comprises mixed gas containing Ar gas, $CF_4$ gas and $CHF_3$ gas, and said second mixed gas comprises mixed gas containing $O_2$ gas and $CF_4$ gas.

3. A fabrication method of a semiconductor device according to claim 2, wherein said second step comprises step of removing a damage layer, an SiC layer and a CFxSi layer formed on said semiconductor substrate in said first step.

4. A fabrication method of a semiconductor device according to claim 1, further comprising, between said second step and said third step, step of etching said semiconductor substrate by using oxygen gas.

5. A fabrication method of a semiconductor device according to claim 2, wherein said first step comprises step of etching said semiconductor substrate to form a trench on said semiconductor substrate, and said second step comprises step of removing a damage layer, an SiC layer and a CFxSi layer formed on bottom of said trench.

6. A fabrication method of a semiconductor device, said fabrication method comprising:

first step of forming a silicon oxide film on a semiconductor substrate;

second step of etching said silicon oxide film by using first mixed gas containing carbon atoms and fluorine atoms until exposure of a surface of said semiconductor substrate; and third step of etching said exposed surface of said semiconductor substrate by using second mixed gas including gas containing fluorine atoms and oxygen gas having a partial pressure ratio equivalent to at least 70%.

7. A fabrication method of a semiconductor device according to claim 6, wherein said first mixed gas comprises mixed gas containing Ar gas, $CF_4$ gas and $CHF_3$ gas, and said second mixed gas comprises mixed gas containing $O_2$ gas and $CF_4$ gas.

8. A fabrication method of a semiconductor device according to claim 7, wherein said third step comprises step of removing a damage layer, an SiC layer and a CFxSi layer formed on said exposed surface of said semiconductor substrate in said second step.

9. A fabrication method of a semiconductor device according to claim 6, further comprising, between said second step and said third step, step of etching said exposed surface of said semiconductor substrate by using oxygen gas.

10. A fabrication method of a semiconductor device, said fabrication method comprising:
first step of conducting first plasma processing on a silicon substrate by using first gas containing carbon atoms; and
second step of conducting second plasma processing on said silicon substrate by using second gas containing oxygen gas, said oxygen gas having a concentration of at least 40% and less than 100%, processing pressure (in Torr) divided by a RF (Radio Frequency) power density (in W/cm²) being at least 0.07 and being at most 0.27.

11. A fabrication method of a semiconductor device according to claim 10, wherein said first step comprises step of forming a concave portion in said silicon substrate by using said first plasma processing.

12. A fabrication method of a semiconductor device according to claim 10, wherein said second plasma processing is conducted by a RF (Radio Frequency) excitation downflow plasma processing system.

13. A fabrication method of a semiconductor device according to claim 11, wherein said second plasma processing is conducted by a RF (Radio Frequency) excitation downflow plasma processing system.

14. A fabrication method of a semiconductor device according to claim 10, wherein said second plasma processing is conducted at a processing temperature of 200° C. or below.

15. A fabrication method of a semiconductor device according to claim 11, wherein said second plasma processing is conducted at a processing temperature of 200° C. or below.

16. A fabrication method of a semiconductor device according to claim 12, wherein said second plasma processing is conducted at a processing temperature of 200° C. or below.

17. A fabrication method of a semiconductor device according to claim 13, wherein said second plasma processing is conducted at a processing temperature of 200° C. or below.

18. A fabrication method of a semiconductor device according to claim 10, wherein said first gas comprises mixed gas containing Ar gas, $CF_4$ gas and $CHF_3$ gas, and
said second gas comprises mixed gas containing $O_2$ gas and $CF_4$ gas.

19. A fabrication method of a semiconductor device according to claim 10, wherein said second step comprises step of removing an SiC layer formed on a surface of said concave portion by bonding of said carbon atoms with silicon atoms of said silicon substrate.

20. A fabrication method of a semiconductor device, said fabrication method comprising:
first step of conducting first plasma processing on a silicon substrate by using first gas containing carbon atoms and thereby forming a concave portion in said silicon substrate;
second step of conducting second plasma processing on an internal face of said concave portion by using second gas containing oxygen gas, said oxygen gas having a concentration of at least 40% and less than 100%, processing pressure (in Torr) divided by a RF (Radio Frequency) power density (in W/cm²) being at least 0.07 and being at most 0.27;
third step of forming a gate insulating film on side face of convex portion surrounded by said concave portion;
fourth step of forming impurity diffusion layers respectively on bottom of said concave portion and on top of said convex portion; and
fifth step of forming a gate electrode on said gate insulating films.

21. In a semiconductor device having an element isolation structure using a field shield electrode, a method for etching an element forming region of a semiconductor substrate isolated by said field shield electrode, said method comprising:
first step of etching said semiconductor substrate by using first gas containing fluorine atoms; and
second step of etching the element forming region of said semiconductor substrate etched in said first step by using second gas containing oxygen gas, said oxygen gas having a partial pressure ratio of at least 70%.

22. An etching method according to claim 21, wherein said first gas contains $CF_4$ gas or $CHF_3$ gas.

23. An etching method according to claim 22, wherein said first gas further contains Ar gas.

24. An etching method according to claim 21, wherein said second gas contains $CF_4$ gas.

25. An etching method according to claim 21, further comprising, after said second step, third step of forming an oxide film on a surface of said semiconductor substrate at the element forming region.

26. A fabrication method of a semiconductor device, said fabrication method comprising:
first step of etching a semiconductor substrate by using first mixed gas containing carbon atoms and fluorine atoms; and
second step of etching said semiconductor substrate subjected to said first step, by using second mixed gas including gas containing fluorine atoms and oxygen gas having a partial pressure ratio equivalent to at least 70%.

27. A fabrication method of a semiconductor device according to claim 26, wherein said first mixed gas comprises mixed gas containing Ar gas, $CF_4$ gas and $CHF_3$ gas, and
said second mixed gas comprises mixed gas containing $O_2$ gas and $CF_4$ gas.

28. A fabrication method of a semiconductor device according to claim 27, wherein said second step comprises step of removing a damage layer, an SiC layer and a CFxSi layer formed on said semiconductor substrate in said first step.

29. A fabrication method of a semiconductor device according to claim 26, further comprising, after said second step, step of etching said semiconductor substrate by using oxygen gas.

30. A fabrication method of a semiconductor device according to claim 27, wherein said first step comprises step of etching said semiconductor substrate to form a trench on said semiconductor substrate, and
said second step comprises step of removing a damage layer, an SiC layer and a CFxSi layer formed on bottom of said trench.

* * * * *